United States Patent
Decker et al.

(10) Patent No.: US 9,837,530 B2
(45) Date of Patent: Dec. 5, 2017

(54) SEMICONDUCTOR DEVICE AND METHOD OF MANUFACTURING THE SAME

(71) Applicant: Infineon Technologies AG, Neubiberg (DE)

(72) Inventors: Stefan Decker, Munich (DE); Sven Lanzerstorfer, Feldkirchen (AT); Thorsten Meyer, Munich (DE); Robert Zink, Riegersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/868,857

(22) Filed: Sep. 29, 2015

(65) Prior Publication Data

US 2016/0093728 A1     Mar. 31, 2016

(30) Foreign Application Priority Data

Sep. 30, 2014    (DE) .................. 10 2014 114 230

(51) Int. Cl.
*H01L 29/00*   (2006.01)
*H01L 29/78*   (2006.01)
(Continued)

(52) U.S. Cl.
CPC ...... *H01L 29/7813* (2013.01); *H01L 29/1095* (2013.01); *H01L 29/407* (2013.01);
(Continued)

(58) Field of Classification Search
None
See application file for complete search history.

(56) References Cited

U.S. PATENT DOCUMENTS 6,285,060 B1 *   9/2001   Korec ................ H01L 29/1095
                                                         257/331
9,178,027 B1 *  11/2015   Zitouni ............... H01L 29/086
(Continued)

FOREIGN PATENT DOCUMENTS

DE    102005052733 B3    5/2007
DE    102004024885 B4    9/2007
(Continued)

OTHER PUBLICATIONS

Office Action Communication of the German Patent and Trademark Office for File Reference 10 2014 114 230.6 dated Aug. 17, 2015.

*Primary Examiner* — Evren Seven
(74) *Attorney, Agent, or Firm* — Baker Botts L.L.P.

(57) ABSTRACT

A semiconductor device comprises a semiconductor body. The semiconductor body comprises insulated gate field effect transistor cells. At least one of the insulated gate field effect transistor cells comprises a source zone of a first conductivity type, a body zone of a second, complementary conductivity type, a drift zone of the first conductivity type, and a trench gate structure extending into the semiconductor body through the body zone along a vertical direction. The trench gate structure comprises a gate electrode separated from the semiconductor body by a trench dielectric. The trench dielectric comprises a source dielectric part interposed between the gate electrode and the source zone and a gate dielectric part interposed between the gate electrode and the body zone. The ratio of a maximum thickness of the source dielectric part along a lateral direction and the minimum thickness of the gate dielectric part along the lateral direction is at least 1.5.

21 Claims, 12 Drawing Sheets

(51) Int. Cl.
    *H01L 29/66*     (2006.01)
    *H01L 29/423*     (2006.01)
    *H01L 29/10*     (2006.01)
    *H01L 29/40*     (2006.01)
    *H01L 29/739*     (2006.01)
    *H01L 29/417*     (2006.01)

(52) U.S. Cl.
    CPC .. *H01L 29/42368* (2013.01); *H01L 29/66734* (2013.01); *H01L 29/7397* (2013.01); *H01L 29/7811* (2013.01); *H01L 29/41766* (2013.01)

(56) References Cited

U.S. PATENT DOCUMENTS

| | | | | |
|---|---|---|---|---|
| 2002/0185679 | A1* | 12/2002 | Baliga | H01L 21/823487 257/329 |
| 2003/0168687 | A1* | 9/2003 | Chidambarrao | H01L 21/26586 257/300 |
| 2005/0145977 | A1 | 7/2005 | Alessandria et al. | |
| 2006/0097312 | A1* | 5/2006 | Poelzl | H01L 29/66734 257/328 |
| 2006/0121676 | A1 | 6/2006 | Darwish | |
| 2009/0218621 | A1* | 9/2009 | Pfirsch | H01L 29/0634 257/342 |
| 2010/0025759 | A1 | 2/2010 | Yoshimochi | |
| 2012/0064684 | A1* | 3/2012 | Hsieh | H01L 29/0634 438/270 |
| 2012/0074489 | A1* | 3/2012 | Hsieh | H01L 29/7813 257/330 |
| 2012/0211831 | A1* | 8/2012 | Hsieh | H01L 21/823481 257/334 |
| 2012/0313161 | A1* | 12/2012 | Grivna | H01L 29/7842 257/330 |
| 2013/0001679 | A1 | 1/2013 | Omori | |
| 2013/0037880 | A1* | 2/2013 | Liu | H01L 29/6634 257/330 |
| 2013/0248982 | A1 | 9/2013 | Grivna | |
| 2013/0334598 | A1* | 12/2013 | Okumura | H01L 29/0607 257/335 |
| 2014/0027813 | A1* | 1/2014 | Kuruc | H01L 29/66348 257/139 |
| 2014/0054682 | A1* | 2/2014 | Padmanabhan | H01L 29/404 257/330 |
| 2014/0273374 | A1* | 9/2014 | Yedinak | H01L 29/66727 438/272 |
| 2014/0299932 | A1* | 10/2014 | Blank | H01L 29/41741 257/330 |
| 2015/0001615 | A1* | 1/2015 | Yong | H01L 29/265 257/330 |
| 2015/0097233 | A1* | 4/2015 | Zundel | H01L 29/105 257/334 |
| 2015/0108568 | A1* | 4/2015 | Terrill | H01L 29/7813 257/331 |
| 2016/0365441 | A1* | 12/2016 | Siemieniec | H01L 21/265 |

FOREIGN PATENT DOCUMENTS

| | | |
|---|---|---|
| DE | 102007013848 B4 | 8/2012 |
| DE | 102007014038 B4 | 2/2015 |
| DE | 102005028224 B4 | 8/2015 |

* cited by examiner

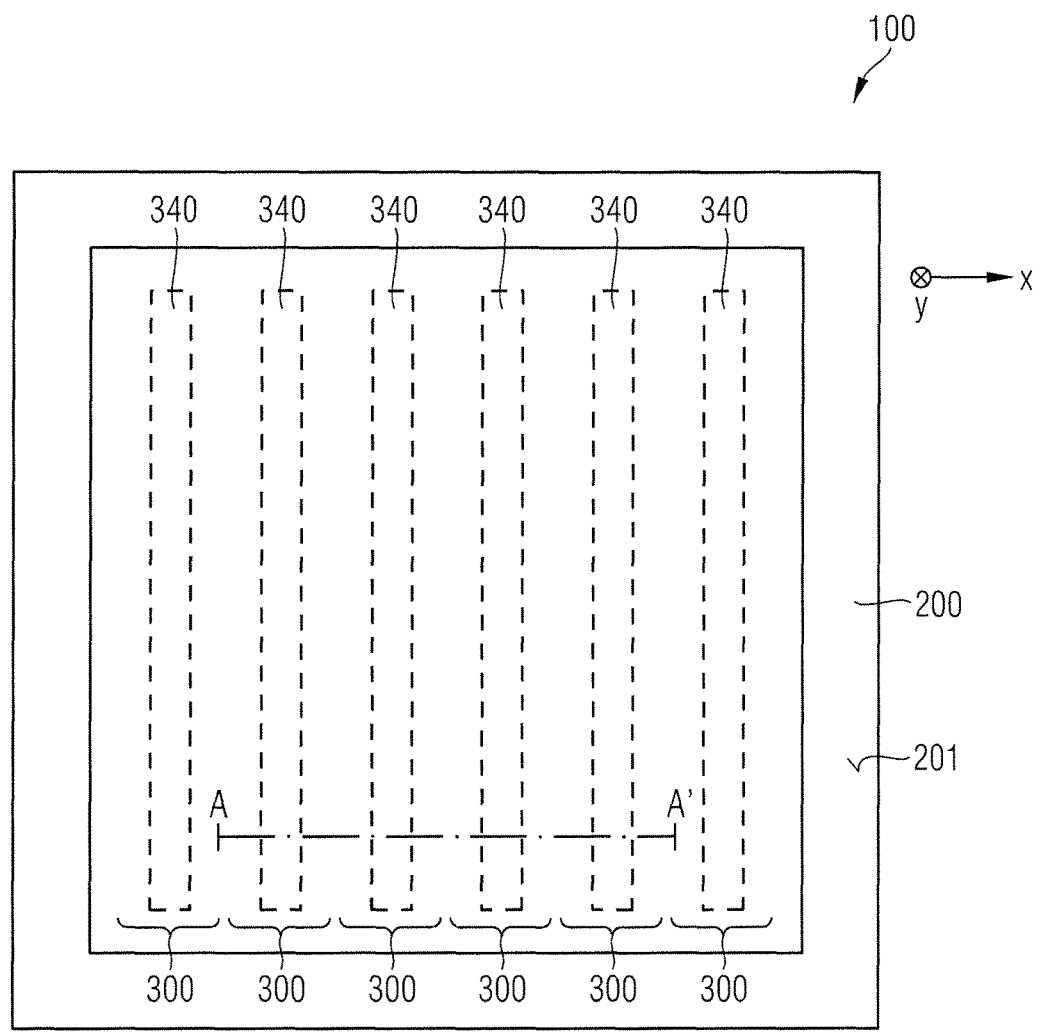

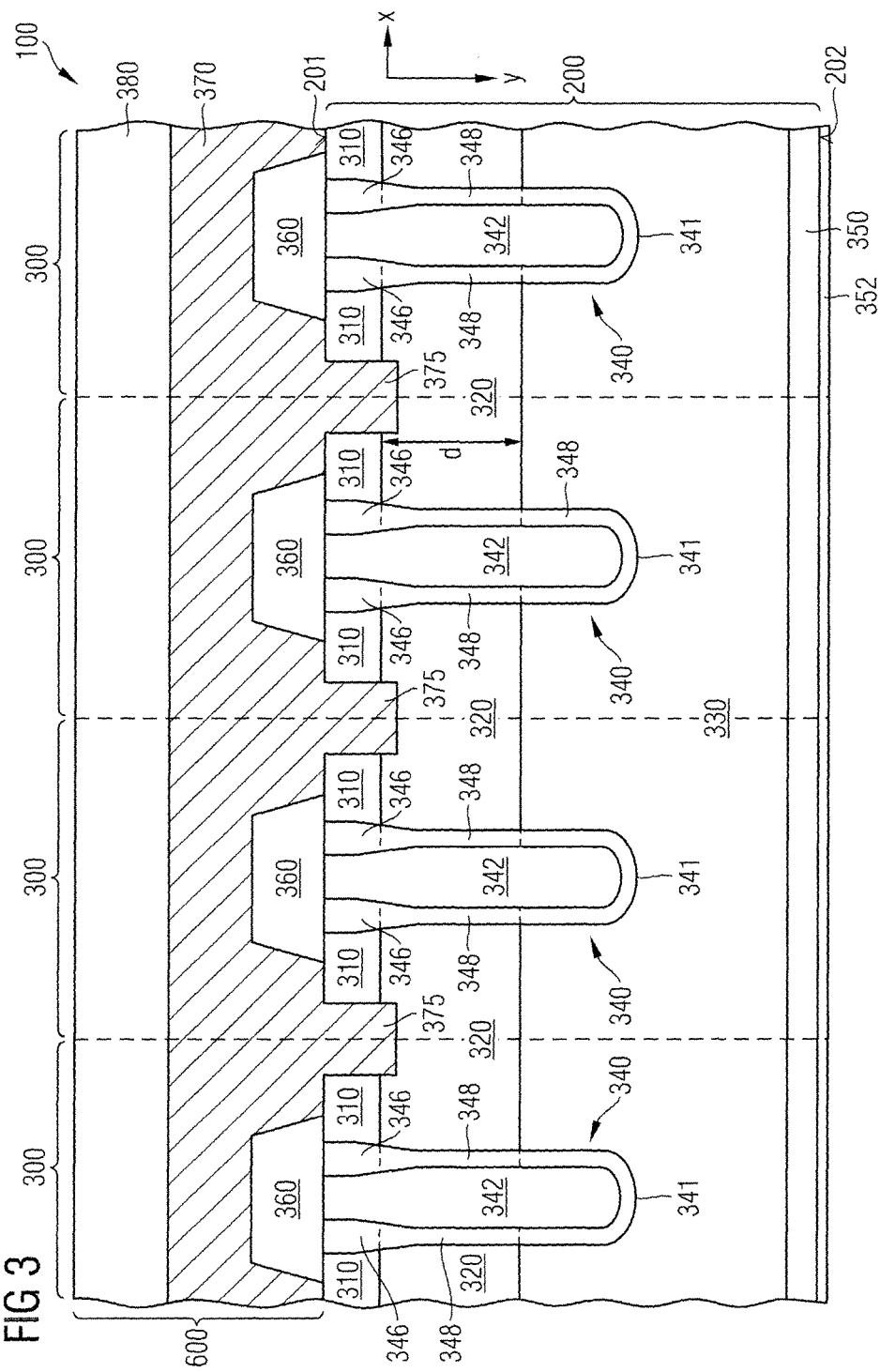

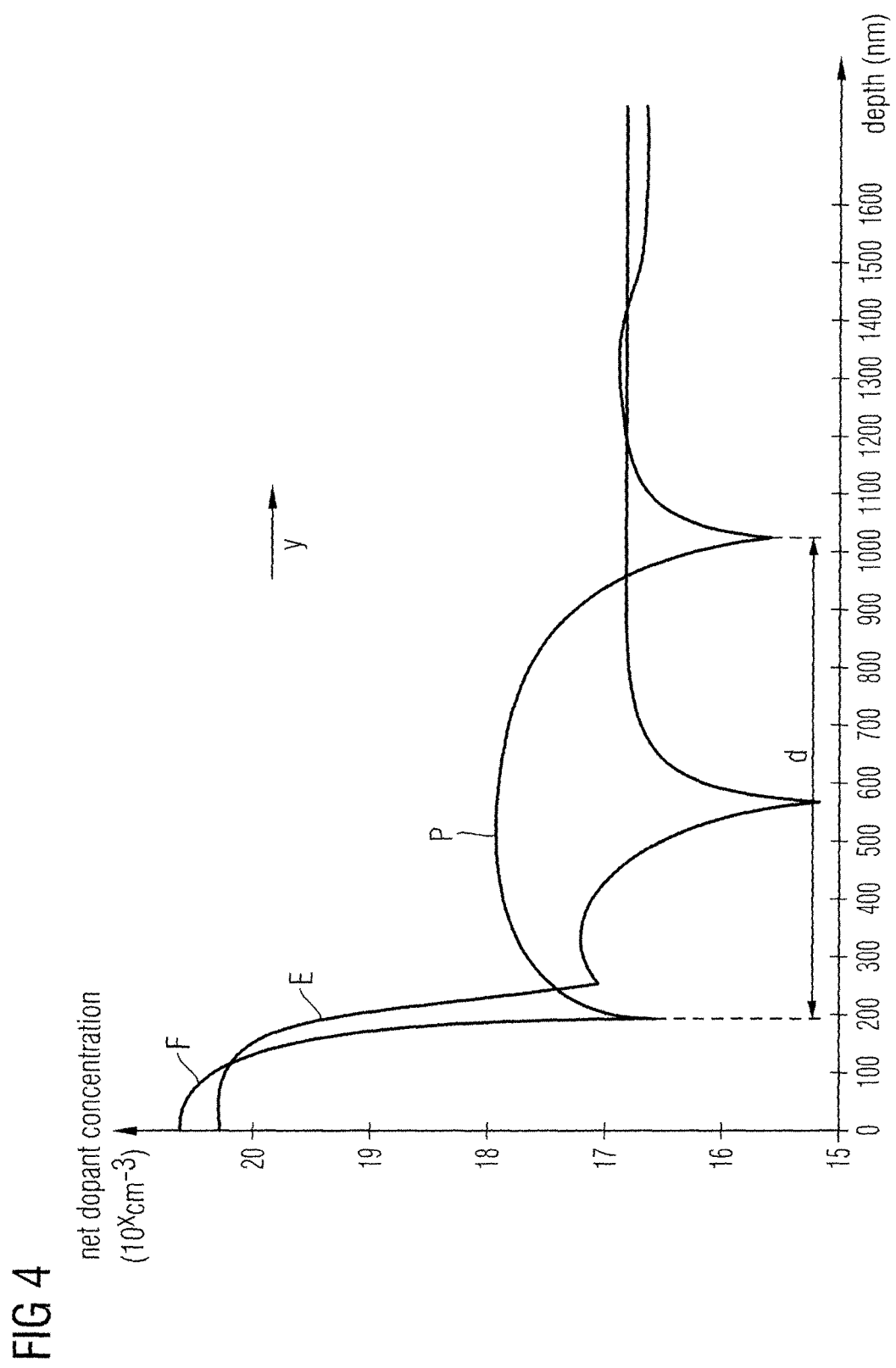

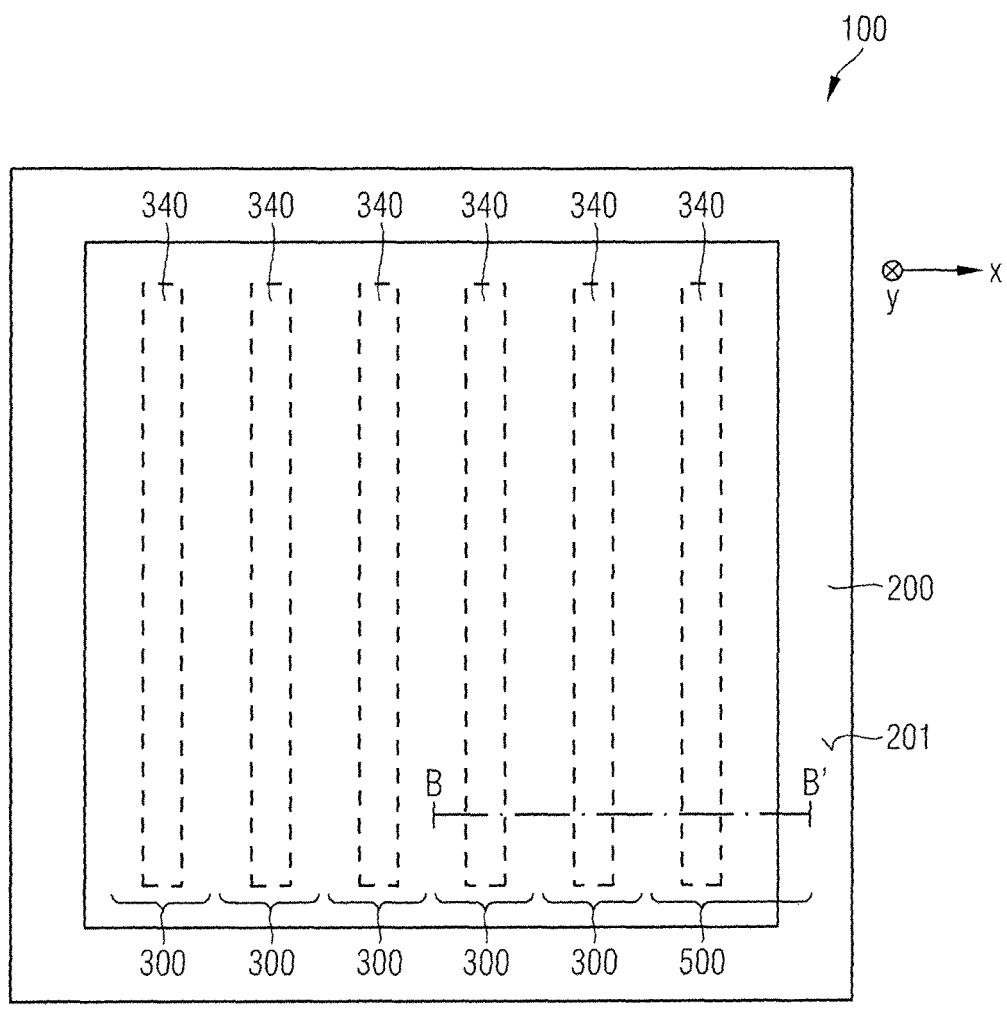

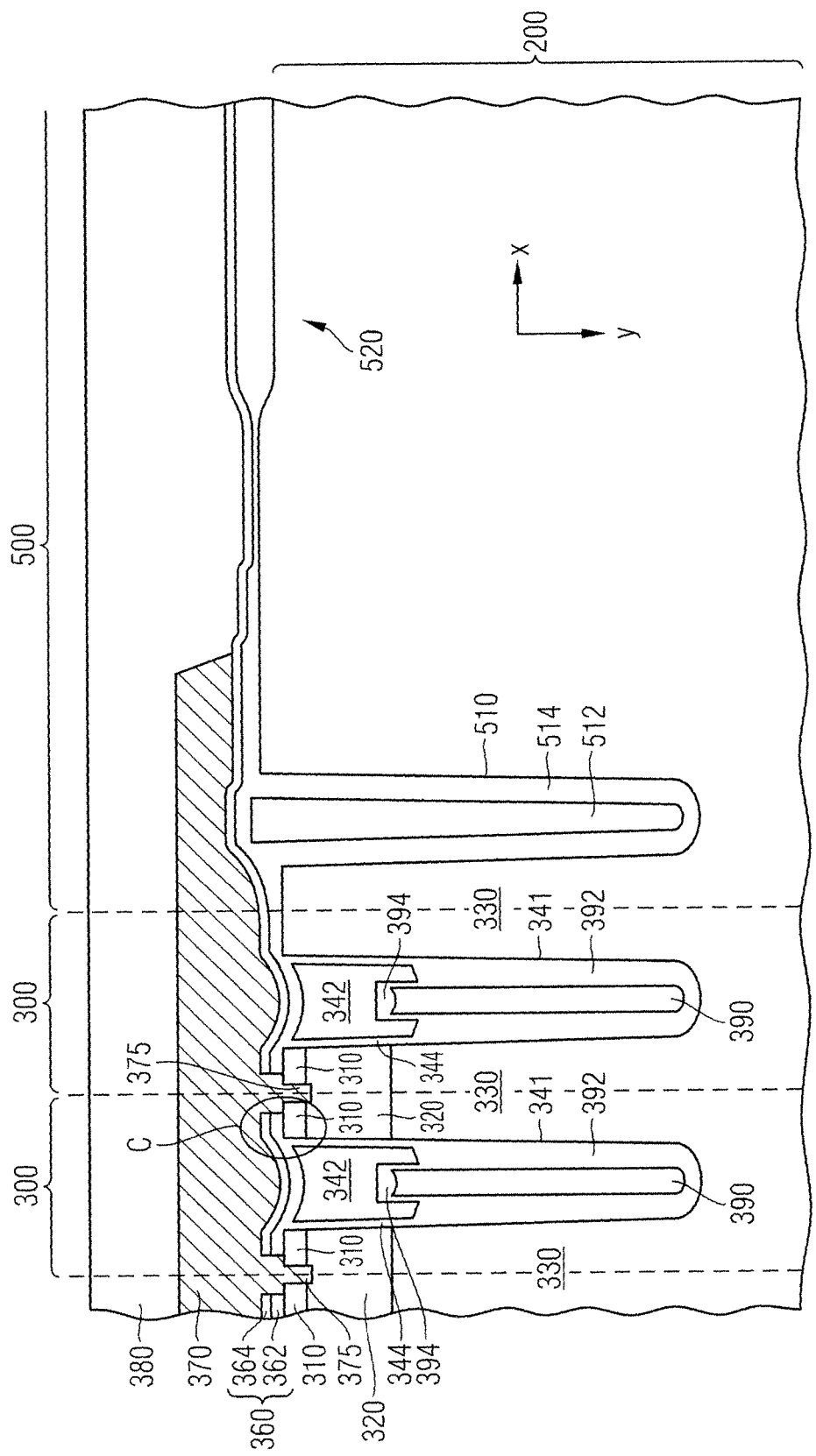

SEMICONDUCTOR DEVICE AND METHOD OF MANUFACTURING THE SAME

CROSS REFERENCE TO RELATED APPLICATION

This application claims priority to German Application Serial No. 102014114230.6 filed Sep. 30, 2014 and entitled "Semiconductor Device and Method of Manufacturing the Same".

BACKGROUND

A key component in semiconductor application is a solid-state switch. As an example, switches turn loads of automotive applications or industrial applications on and off. Solid-state switches typically include a plurality of vertical insulated gate field effect transistor (IGFET) cells for switching a current through a semiconductor body. It has been proven beneficial to integrate the vertical IGFET cells, e.g. metal oxide semiconductor field effect transistors (MOSFETs) or insulated gate bipolar transistors (IGBTs) together with further circuit elements in one power chip. The further circuit elements may comprise transistors, e.g. complementary metal oxide semiconductor (CMOS) field effect transistors, for providing a logical circuit configured to control and/or monitor the power chip on the basis of sensor structures like a temperature sensor or a current sensor.

It is desirable to improve the operating characteristic of a solid-state switch and to enhance flexibility when integrating vertical insulated gate field effect transistor cells together with further circuit elements.

SUMMARY

According to an embodiment of a semiconductor device, the semiconductor device comprises a semiconductor body. The semiconductor body comprises insulated gate field effect transistor cells. At least one of the insulated gate field effect transistor cells comprises a source zone of a first conductivity type, a body zone of a second, complementary conductivity type, a drift zone of the first conductivity type, and a trench gate structure extending into the semiconductor body through the body zone along a vertical direction. The trench gate structure comprises a gate electrode separated from the semiconductor body by a trench dielectric. The trench dielectric comprises a source dielectric part interposed between the gate electrode and the source zone and a gate dielectric part interposed between the gate electrode and the body zone. The ratio of a maximum thickness of the source dielectric part along a lateral direction and the minimum thickness of the gate dielectric part along the lateral direction is at least 1.5.

According to an embodiment of a method of manufacturing a semiconductor device comprising a semiconductor body including insulated gate field effect transistor cells, the method comprises forming of at least one of the insulated gate field effect transistor cells by forming a drift zone of the first conductivity type, forming a body zone of a second, complementary conductivity type, and forming a source zone of a first conductivity type. Forming of at least one of the insulated gate field effect transistor cells further comprises forming a trench gate structure extending into the semiconductor body through the body zone along a vertical direction, and forming, within the gate trench structure, a trench dielectric and a gate electrode separated from the semiconductor body by the trench dielectric. The trench dielectric comprises a source dielectric part interposed between the gate electrode and the source zone and a gate dielectric part interposed between the gate electrode and the body zone. The trench dielectric is formed such that the ratio of a maximum thickness of the source dielectric part along a lateral direction and the minimum thickness of the gate dielectric part along the lateral direction is at least 1.5.

According to another embodiment of a method of manufacturing a semiconductor device comprising a semiconductor body, the method comprises forming a trench within the semiconductor body, performing a first oxidation process to form an oxide layer lining an inner wall of the trench, filling the trench with an electrode material, and performing, after filling the trench, a second oxidation process such that the oxide layer has a bird's beak structure tapering from a trench opening into the trench.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

FIG. 2A is a schematic plan view of a portion of a semiconductor device comprising insulated gate field effect transistor cells according to an embodiment.

FIG. 3 is a schematic cross-sectional view of a portion of a semiconductor device taken along the section plane A-A' of FIGS. 2A, 2B according to an embodiment.

FIG. 4 is a diagram showing a cross-sectional net dopant concentration vs. depth of a portion of a semiconductor device according to an embodiment.

FIG. 5 is a schematic plan view of a portion of a semiconductor device comprising insulated gate field effect transistor cells according to an embodiment.

FIG. 6 is a schematic cross-sectional view of a portion of a semiconductor device taken along the section plane B-B' of FIG. 5 according to an embodiment.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural and logical changes may be made without departing from the scope of the present invention. For example features illustrated or described for one embodiment can be used on or in conjunction with other embodiments to yield yet a further embodiment. It is intended that the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, n-type or n-doped may refer to a first conductivity type while p-type or p-doped is referred to a second conductivity type. Semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration less than the doping concentration of an "n"-doping region while an "n$^+$"-doping region has a larger doping concentration than the "n"-doping region. Indicating the relative doping concentration does not, however, mean that doping regions of the same relative doping concentration have the same absolute doping concentration unless otherwise stated. For example, two different n$^+$ regions can have different absolute doping concentrations. The same applies, for example, to an n$^+$ and a p$^+$ region. The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

It is to be understood that the features of the various embodiments described herein may be combined with each other, unless specifically noted otherwise.

Figure 1:
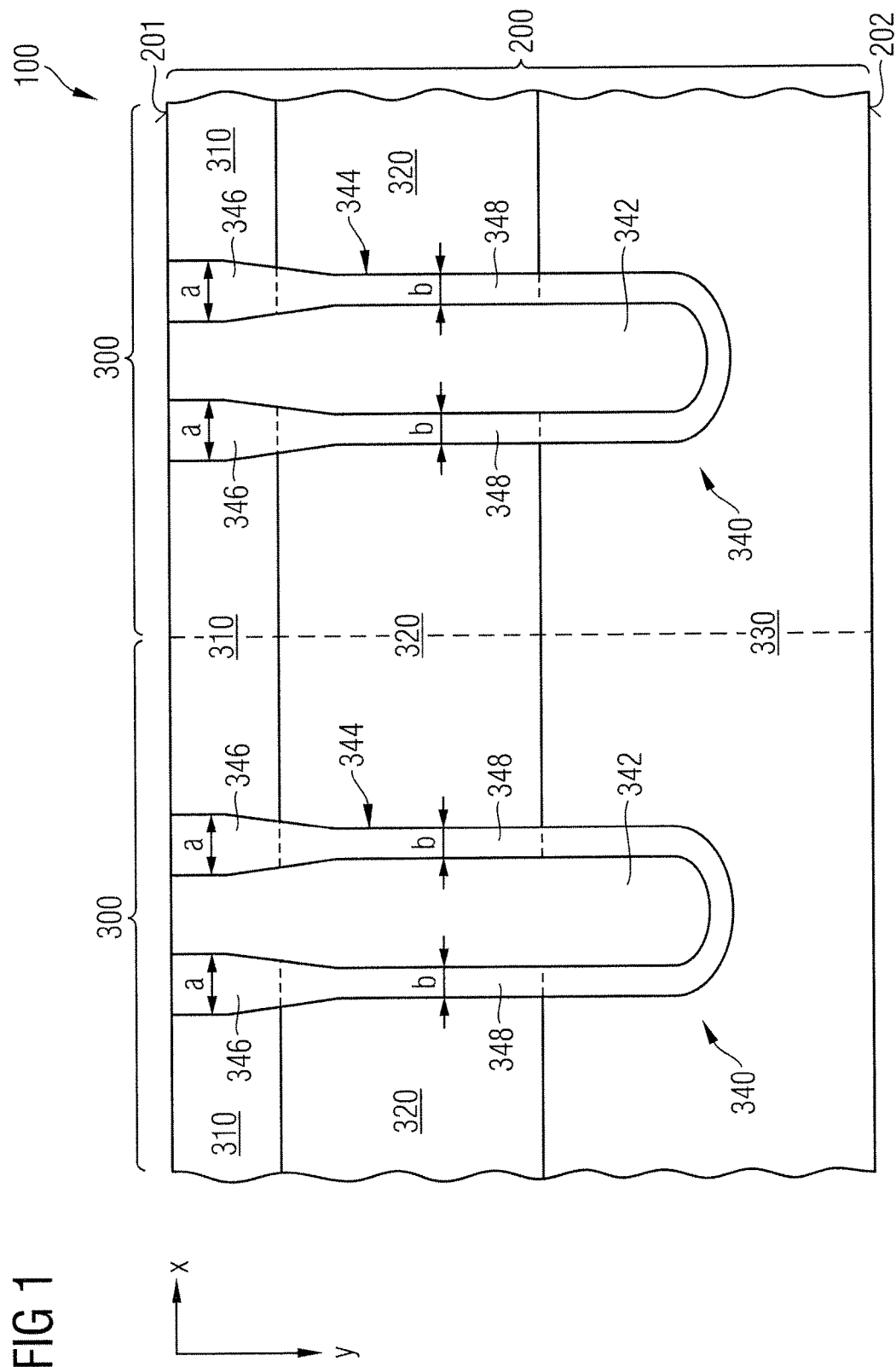
FIG. 1 is a schematic cross-sectional view of a portion of a semiconductor device according to an embodiment.

FIG. 1 is a schematic cross-sectional view of a portion of a semiconductor device 100 according to an embodiment. The semiconductor device 100 comprises a semiconductor body 200. The semiconductor body 200 has a first surface 201 and a second surface 202 which is opposite to the first surface 201. The normal to the first and second surfaces 201, 202 defines a vertical direction y and directions orthogonal to the normal direction are lateral directions, e.g. x. The semiconductor body 200 comprises insulated gate field effect transistor cells 300. At least one of the insulated gate field effect transistor cells 300 comprises a source zone 310 of a first conductivity type, a body zone 320 of a second, complementary conductivity type, a drift zone 330 of the first conductivity type, and a trench gate structure 340. The trench gate structure 340 extends into the semiconductor body 200 through the body zone 320 along the vertical direction y. The trench gate structure 340 comprises a gate electrode 342, which is separated from the semiconductor body 200 by a trench dielectric 344. The trench dielectric comprises a source dielectric part 346, which is interposed between the gate electrode 342 and the source zone 310, and a gate dielectric part 348, which is interposed between the gate electrode 342 and the body zone 320. The ratio of a maximum thickness a of the source dielectric part 346 along the lateral direction x and the minimum thickness b of the gate dielectric part 348 along the vertical direction y is at least 1.5.

At least one part of the source dielectric part 346 is made to be thicker than at least a part of the gate dielectric part 348 by a factor of at least 1.5. Thus, damages generated by an implantation process for forming the source zone 310 may be compensated by the first dielectric part 346 being thicker than the gate dielectric part 348. Thus, a thin gate dielectric of the trench dielectric 344 may be provided without deteriorating leakage current between the source zone 310 and the gate electrode 342.

The minimum thickness b of the gate dielectric part 348 may be at most 20 nm and the maximum thickness a of the source dielectric part 346 may be at least 10 nm. By providing a gate dielectric part 348 having a minimum thickness b of at most 20 nm, the average net dopant concentration of the body zone 320 adjoining the gate dielectric part 348 may be higher as compared to an average net dopant concentration of a body zone directly abutting a gate dielectric part having a minimum thickness of, for example, 30 nm. The body zone 320 may have an average net dopant concentration of at least $1 \times 10^{17}$ cm$^{-3}$. Thus, latch up effects, which may occur in a lowly doped body zone 320, may be prevented, wherein at the same time the threshold voltage of the insulated gate field effect transistor cells 300 is kept in a range of, for example, 1V to 5V.

FIG. 2A is a schematic plan view of a portion of a semiconductor device 100 comprising insulated gate field effect transistor cells 300 according to an embodiment. As can be seen from FIG. 2A, the vertical direction y extends orthogonal into the first surface 201 (image plane of FIG. 2A), wherein the lateral direction x is parallel to the first surface 201. The semiconductor body 200 comprises the insulated gate field effect transistor cells 300, wherein the trench gate structures 340 are indicted by dashed lines. The trench gate structures 340 extend from the first surface 201 into the semiconductor body 200. The trench gate structures 340 may be parallel stripes arranged in a regular pattern, as shown in FIG. 2A. According to other embodiments, the lateral cross-sectional areas of the trench gate structures 340 may be circles, ellipsoids, ovals or rectangles, i.e. squares with or without rounded corners or rings. The trench gate structures 340 may be formed as so-called needle trench gate structures, in which a plurality of needle-like trenches extend into the semiconductor body 200. In this embodiment, the trench dielectric 344 may form a concentric ring surrounding the needle-like gate electrode 342, wherein the ring may be a circle, an ellipsoid, an oval, or an rectangle, e.g. squares with rounded corners.

Figure 2B:
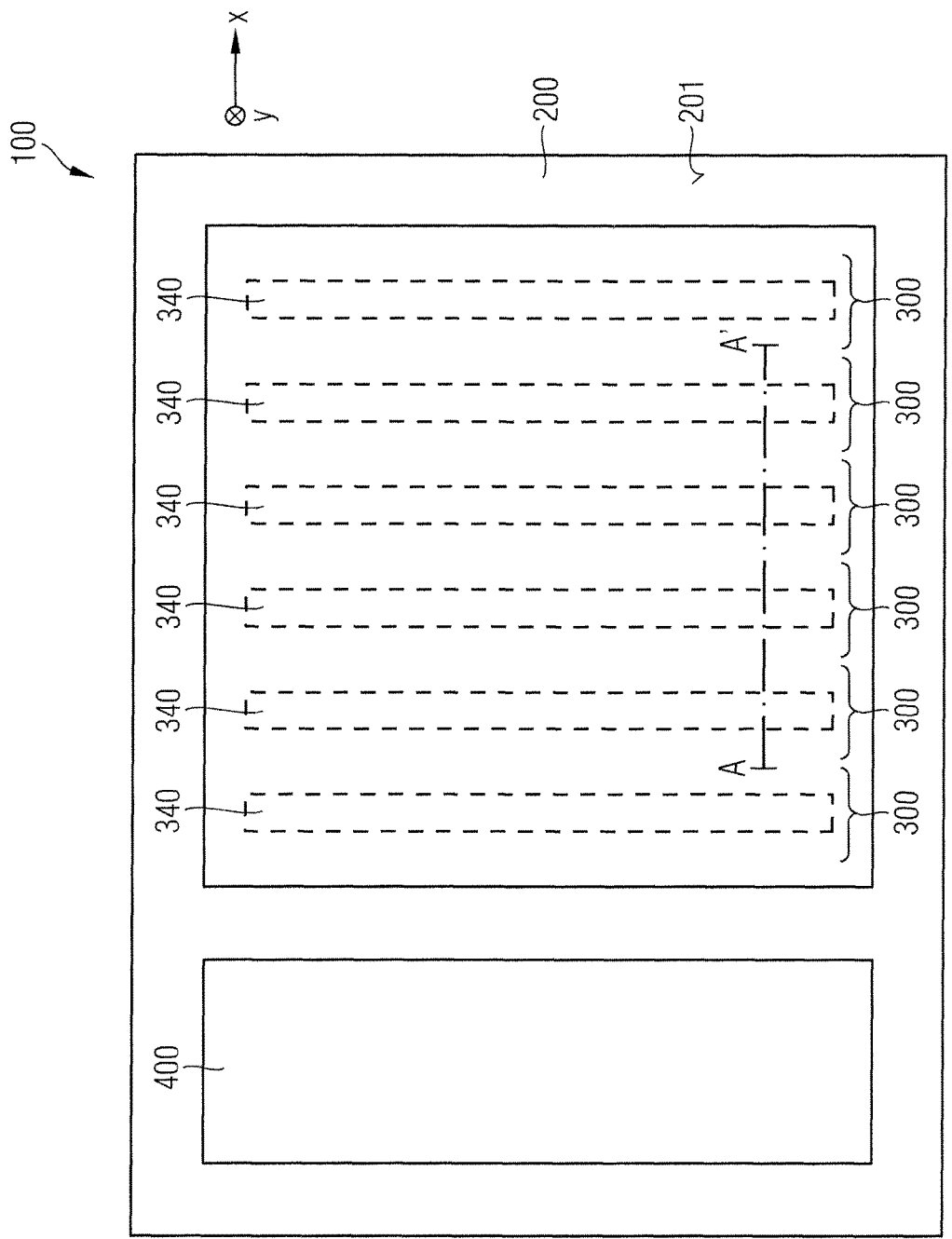
FIG. 2B is a schematic plan view of a portion of a semiconductor device comprising insulated gate field effect transistor cells and further circuit elements according to another embodiment.

FIG. 2B is a schematic plan view of a portion of a semiconductor device 100 comprising insulated gate field effect transistor cells 300 and further circuit elements 400 according to another embodiment. The further circuit elements 400 may form a logical circuit for controlling and/or monitoring the switching behaviour of the insulated gate field effect transistor cells 300 on the basis of sensor components like a temperature sensor or a current sensor, or may perform further data processing tasks. Therefore, the logical circuit of the further circuit elements may comprise a plurality of transistors, e.g. complementary metal oxide semiconductor (CMOS) field effect transistors, to form logical circuit elements. Thus, according to the embodiment, the semiconductor device 100 is an integrated circuit comprising the insulated gate field effect transistor cells 300 and further circuit elements 400, wherein at least one of the further circuit elements 400 comprises a transistor. The transistor may have a gate dielectric with a thickness varying at most 10% of the minimum thickness b of the gate dielectric part 348. Thus, the gate dielectric part 346 and the gate dielectric of the transistor of the further circuit elements 400 may be formed at the same time with a comparable or even the same thickness in the same oxidation process.

FIG. 3 is a schematic cross-sectional view of a portion of a semiconductor device 100 taken along the section plan A-A' of FIGS. 2A, 2B according to an embodiment.

The semiconductor device 100 includes the semiconductor body 200. The semiconductor body 200 includes a semiconductor material, for example silicon (Si), silicon carbide (SiC), germanium (Ge), silicon germanium (SiGe), gallium nitride (GaN) or gallium arsenide (GaAs). The semiconductor body 200 may include a semiconductor layer structure having one or more semiconductor layer(s), e.g. epitaxial layer(s) on a semiconductor substrate.

The semiconductor body 200 has the first surface 201 and the second surface 202, which is opposite to the first surface 201. A distance between the first and second surfaces 201, 202 is selected to achieve a specific voltage blocking capability and may be at least 30 μm, for example at least 175 μm. Other embodiments may provide semiconductor bodies 200 with a thickness of several 100 μm. The semiconductor body 200 may have a rectangular shape with an edge length in the range of several millimeters.

The semiconductor body 200 includes the insulated gate field effect transistor cells 300, which are arranged sequentially in a lateral direction x. The insulated gate field effect transistor cells 300 may comprise transistor cells such as IGBTs (insulated gate bipolar transistors), e.g. RC-IGBTs (reverse-conducting IGBTs), RB-IGBTs (reverse-blocking IGBTs) and IGFETs (insulated gate field effect transistors) including MOSFETs (metal oxide semiconductor field effect transistors). The insulated gate field effect transistor cells 300 and/or the further circuit elements 400 may be lateral or vertical transistor cells defined by appropriate process technologies including smart power technology processes, bipolar complementary metal-oxide-semiconductor (CMOS) double-diffused metal-oxide-semiconductor (DMOS) processes (BCD-processes) including optional buried layer and up-drain designs.

In the embodiment as shown in FIG. 3, at least one insulated gate field effect transistor cell 300 forms a vertical IGFET for switching a current between the first surface 201 and the second surface 202. The trench gate structures 340, which are formed within trenches 341, extend from the first surface 201 in the vertical direction y into the semiconductor body 200. The gate electrode 342 is separated from the semiconductor body 200 by the trench dielectric 344, wherein the trench dielectric 344 abutting and being interposed between the gate electrode 342 and the body zone 320 is formed with a lower thickness than the trench dielectric 344 abutting and being interposed between the gate electrode 342 and the source zone 310.

In each insulated gate field effect transistor cell 300, body zones 320 are additionally formed in a mesa zone between adjacent trench gate structures 340. Within the body zones 320, source zones 310 are likewise provided in a manner adjoining the trench dielectric 344, the source zones 310 reaching as far as the first surface 201 of the semiconductor body 200. The body zone 320 adjoins a drift zone 330 guiding a gate-controlled current between the source zone 310 and a common drain zone 350 at the second surface 202 of the semiconductor body 200. The gate trench structures 340 extend from the first surface 201 through the body zones 320 into the drift zone 330. The source zones 310, the drift zone 330, and the drain zone 350 are of a first conductivity type, wherein the body zone 320 is of a second conductivity type. On the second surface 202, a drain electrode 352 may be provided to electrically contact the common drain zone 350.

As can be further seen from FIG. 3, the insulated gate field effect transistor cells 300 may be electrically connected via a wiring and insulation region 600 having a patterned wiring structure 370 and a patterned isolation structure 360 including one, two, three or even more wiring levels, e.g. metal and insulating levels. The wiring structure 370 may consist of or contains as main constituent(s) aluminum Al, copper Cu, or alloys of aluminum or copper, for example AlSi, AlCu or AlSiCu. According to other embodiments, the wiring structure 370 may contain one, two, three or more sub-layers, each sub-layer containing as a main constituent(s) one of nickel Ni, titanium Ti, silver Ag, gold Au, platinum Pt, tungsten W and/or palladium Pd. For example, a sub-layer may contain a metal nitride or a metal alloy containing Ni, Ti, Ag, Au, Pt, W, and/or Pd.

The wiring and insulation region 600 further includes a passivation layer 380 formed on the wiring structure 370 and the isolation structure 360. The isolation structure 360 and the passivation layer 380 may include any dielectric or a combination of dielectrics adapted to isolate the semiconductor body 200 from the wiring structure 370, or the wiring structure 370 from an outer contact except a source terminal. The isolation structure 360 and the passivation layer 380 may include one or any combination of an oxide, a nitride, an oxynitride, a high-k material, an amide, an insulating resin or glass such as tetraethylorthosilicate (TEOS)—undoped silicate glass (USG)), or a phosphor silicate glass (PSG), or a boron phosphor silicate glass (BPSG), for example.

The body zone 320 and the source zones 310 are contacted by the patterned wiring structure 370 by a contact region on the first surface 201 and by trench contacts 375, which extend from the first surface 201 into the semiconductor body 200 in the insulated gate field effect transistor cells 300. According to the illustrated embodiment, the trench contacts 375 reach the body zones 320 at a distance to the first surface 201 such that the source zones 310 are formed in mesa portions between the trench contacts 375 and the source dielectric parts 346 of the trench dielectric 344 of the trench gate structures 340. The trench contacts 375 significantly reduce the total impurity amount in the body zones 320. The trench contacts 375 may contain a highly doped polycrystalline silicon or may contain a metal material such as tungsten W. A contact to both the source zone of a first conductivity type and the body zone of a second conductivity type may be achieved by a silicide layer in a contact region between the body zone 320 and the metal material within the trench contacts 375.

According to another embodiment, the body zone 320 may also be extended up to the first surface 201 in the region of the trench contacts 375, wherein the contact to the source zones 310 and the body zones 320 is provided in a region of the first surface 201. In this embodiment, the source dielectric part 346 is on a same vertical level as the source zones 310 and the body zones 320. However, the source dielectric part 346 being interposed between the gate electrode 342 and the source zone 310 has to be understood as a source dielectric part 346 being interposed between and directly abutting the gate electrode 342 and the source zones 310. In other words, the source dielectric part 346 is directly sandwiched between the gate electrode 342 and the source zone 310, without no further regions being interposed between the source dielectric part 346 and the source zone 310 or the source dielectric part 346 and the gate electrode 342.

Due to the minimum thickness of the gate dielectric part 348 being, according to an embodiment, at most 20 nm, or at most 15 nm, or at most 10 nm, the net dopant concentration of the body zone 320 can be enhanced in comparison to insulated gate field effect transistor cells having a gate dielectric thickness of about 30 nm. The minimum thickness of the gate dielectric part 348 may be at least 6 nm to prevent leakage currents due to a trap-trap conduction mechanism in the gate dielectric. According to an embodiment, the minimum thickness of the gate dielectric part 348 may be at least 8 nm, 10 nm, or 15 nm. The maximum thickness a of the source dielectric part 346 may be at least 10 nm. In another embodiment, the maximum thickness a of the source dielectric part 346 may be at least 15 nm, 20 nm, 25 nm, 30 nm or 40 nm. In an embodiment, the maximum thickness a of the source dielectric part 346 may be at most 30 nm, 40 nm, 50 nm, 75 nm, 100 nm, 150 nm or 200 nm.

FIG. 4 is a diagram showing a cross-sectional net dopant concentration versus the depth along the vertical direction y of a portion of a semiconductor device 100 according to an embodiment. Herein, the first surface 201 as shown in FIG. 1 or FIG. 3 is located at a depth of 0 nm. The first net dopant concentration profile E illustrates a net dopant concentration suitable for a thickness of the gate dielectric part 348 of about 30 nm, wherein the second net dopant concentration profile F illustrates a net dopant concentration profile suitable for a thickness of the gate dielectric part 348 having a minimum thickness along the lateral direction of at most 20 nm or being about 10 nm.

As can be seen from FIG. 4, the first net dopant concentration profile E forms a source zone 310 up to a depth of 250 nm, followed by the body zone 320 from 250 nm to 550 nm, which is followed by the drift zone 330 starting from 550 nm. The second net dopant concentration profile F forms a source zone up to a depth of 200 nm, followed by the body zone 320 being extended from a depth of 200 nm to 1000 nm, which is then followed by the drift zone 330 starting from 1000 nm depth and being extended to the common drain zone 350.

As can be seen from the embodiment of a semiconductor device 100 having the second net dopant concentration profile F, the body zone 320 may have an average net dopant concentration of at least $1 \times 10^{17}$ cm$^{-3}$. Thus, latch up effects, which may occur in a lowly doped body zone 320, may be prevented. In addition, the provision of a highly doped region in a lowly doped body zone 320 adjoining the trench contact 375, leading to a further implantation step, is not necessary. Herein, the body zone 320 has a net dopant concentration peak profile along the vertical direction y, which declines from the peak P towards the source zone 310, which declines from the peak P towards the drift zone 330 and which has a peak net dopant concentration of at least $5 \times 10^{17}$ cm$^{-3}$. The maximum or peak P of the net dopant concentration profile may be located in or around a center part of the body zone 320 along the vertical direction y. The net dopant concentration peak profile of the body zone 320 of the profile F may be a Gaussian profile caused by a thermal diffusion broadening after ion implantation.

Depending, inter alia on ion implantation parameters such as energy and dose and a thermal budget, a dopant concentration profile of the body zone 320 having a peak profile similar to the second net dopant concentration profile F allows for a reduction of threshold voltage variations compared with the first net dopant concentration profile E. In addition, the relatively high net dopant concentration of the body zone 320 has two further advantages. Firstly, the voltage drop of the holes generated by impact ionization when flowing through the body zone 320 to the contact trenches 375 is reduced and the triggering of a parasitic npn-bipolar transistor is shifted towards higher hole current. Secondly, the leakage current (electron current) for higher temperatures flowing from the source zone 310 to the drain zone 320 is reduced for higher dopant concentration of the body zone 320 and a thermal run-away is shifted to higher temperatures.

FIG. 5 is a schematic plan view of a portion of a semiconductor device 100 comprising insulated gate field effect transistor cells 300 and further comprising an edge termination structure 500 according to an embodiment. As can be seen from FIG. 5, the semiconductor device 100 is comparable to that as shown in FIG. 2A, wherein a further edge termination structure 500 having an edge termination electrode 510 is provided. FIG. 6 is a schematic cross-sectional view of a portion of a semiconductor device 100 taken along the section plane B-B' of FIG. 5 according to an embodiment.

As can be seen from FIG. 6, the structure of the insulated gate field effect transistor cells 300 is comparable to the schematic cross-sectional view of the insulated gate field effect transistor cells 300 as shown in FIG. 3. The isolation structure 360 comprises a first isolation layer 362 on the first surface 201 and an optional second isolation layer 364 on the first isolation layer 362.

According to the embodiment of FIG. 6, the trench gate structure 340 comprises, in addition to the gate electrode 342, a field electrode 390. Herein, the gate trench structure 340 is formed in an upper part with the trench dielectric 344, which merges into a field dielectric 392 in a lower part of the gate trench structure 340. The field electrode 390 is electrically separated from the gate electrode 342 and may be electrically coupled to a reference voltage, e.g. a source potential or to a different reference voltage. In the edge termination structure 500, an edge termination electrode 512 is provided, which adjoins a field dielectric 514 within an edge termination trench 510. In addition, a shallow trench isolation region or LOCOS (local oxidation of silicon) region 520 may be optionally provided in an edge portion of the semiconductor device 100.

Figure 7:
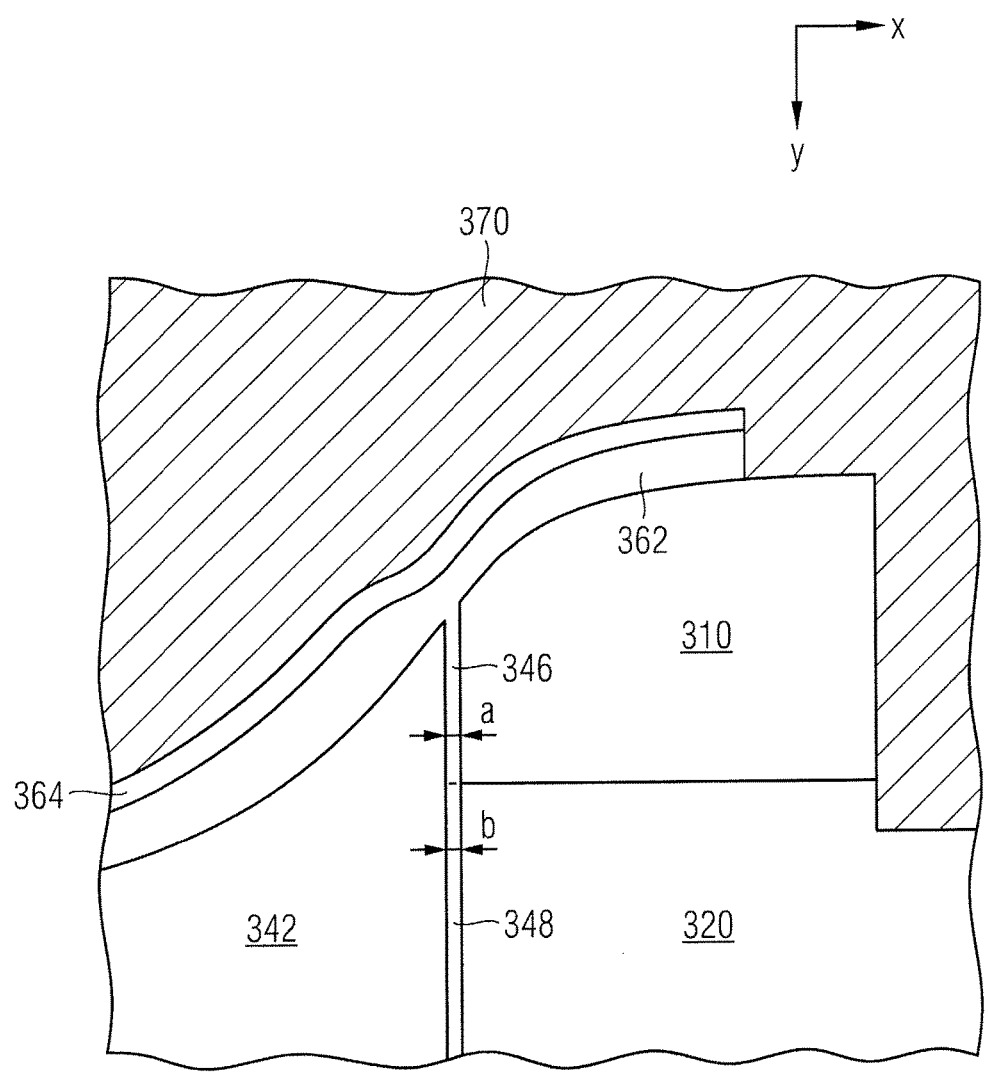
FIG. 7 is a detailed view of a portion C of the schematic cross-sectional view of FIG. 6 showing a gate trench structure with a uniform trench dielectric width.
Figure 8:
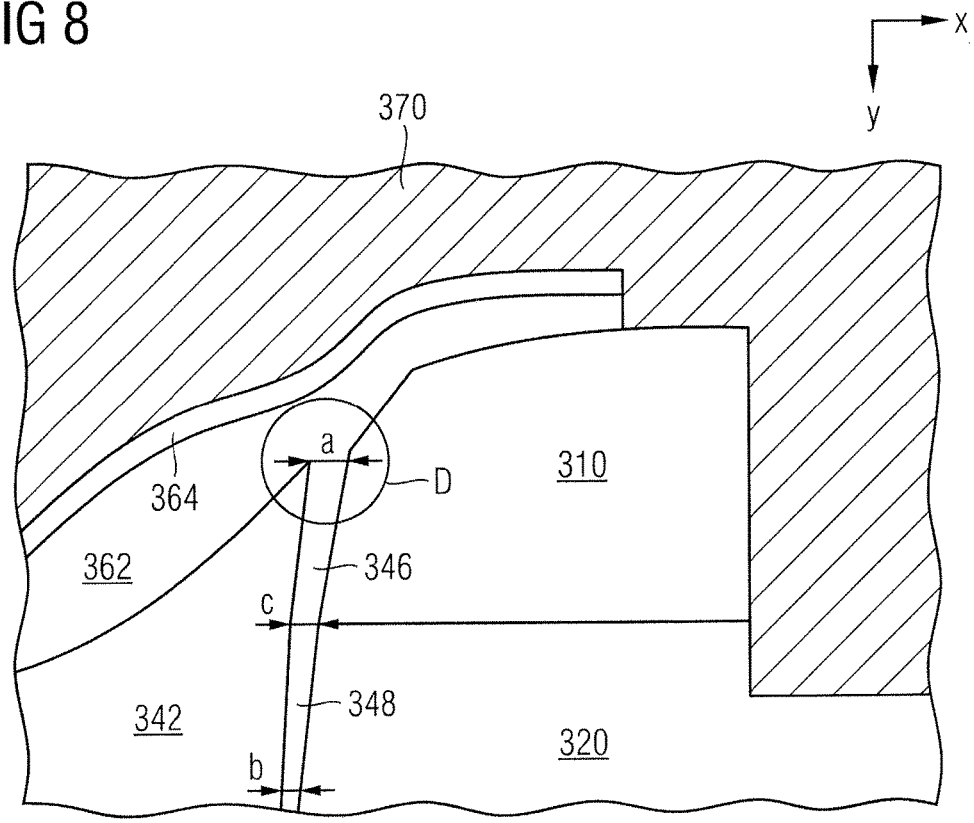
FIG. 8 is a detailed view of a portion C of the schematic cross-sectional view of FIG. 6 showing a gate trench structure with a trench dielectric width profile according to an embodiment.

In the following, the detailed structure of the trench dielectric 344 comprising the source dielectric part 346 and the gate dielectric part 348 will be described on the basis of FIG. 7 and FIG. 8, which are detailed views of a portion C of the schematic cross-sectional view of FIG. 6, wherein FIG. 8 shows a trench dielectric 344 according to an embodiment, and FIG. 7 shows a trench dielectric having a uniform width and is used for comparison with the embodiment of FIG. 8.

Figure 9:
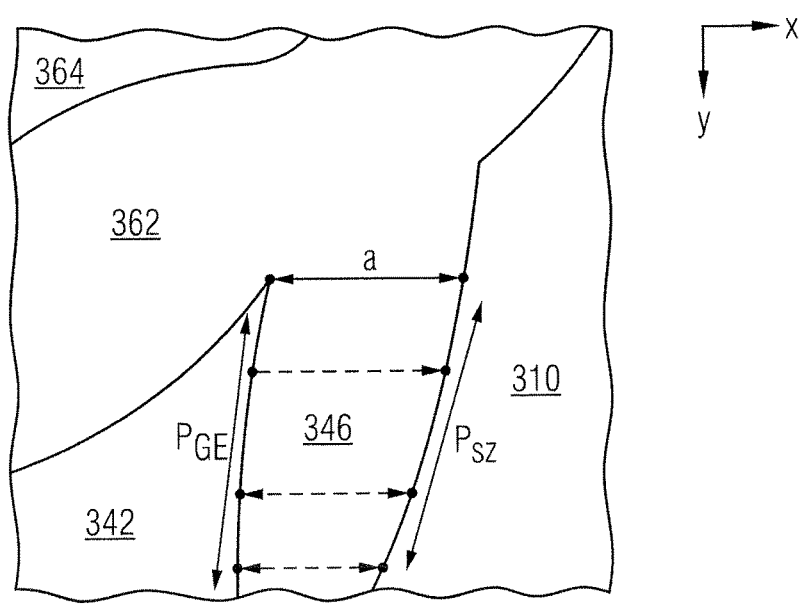
FIG. 9 is a detailed view of a portion D of the schematic cross-sectional view of FIG. 8 showing an illustration of determining the trench dielectric width.

As can be seen from the comparison of FIG. 8 and FIG. 7, in FIG. 8 the trench dielectric 344 comprising the source dielectric part 346 and the gate dielectric part 348 has a bird's beak structure tapering from the source dielectric part 346 to the gate dielectric part 348, wherein in FIG. 7 the gate dielectric 344 has a uniform width. According to the embodiment of FIG. 8, the maximum thickness a of the source dielectric part 346 along a lateral direction x is greater than the minimum thickness b of the gate dielectric part 348 along the lateral direction x by a factor of at least 1.5. As can be seen from FIG. 9, the maximum thickness a is determined by measuring all shortest distances in the lateral direction x, i.e. parallel to the first surface 201, between every point $P_{GE}$ of the gate electrode 342 directly abutting the source dielectric part 346 of the trench dielectric 344 and every point $P_{SZ}$ at the same depth level of the source zone 310 directly abutting the source dielectric part 346, wherein the maximum distance is the maximum thickness of the source dielectric part 346. The minimum thickness b is determined in an analogous way as the maximum thickness a.

In an embodiment, the ratio of the minimum thickness c of the source dielectric part 346 along the lateral direction x and the minimum thickness b of the gate dielectric part along the lateral direction x is at least 1.1, or at least 1.2, or at least 1.5. The ratio of the maximum thickness a of the source dielectric part 346 along the lateral direction x and the minimum thickness b of the gate dielectric part 348 along the lateral direction x is at least 1.5, or may be at least 1.7, or at least 2, or at least 3, or at least 5. In an embodiment, the ratio of an average thickness of the source dielectric part along the lateral direction x and the average thickness of the gate dielectric part 348 along the lateral direction x may be at least 1.1, or at least 1.3, or at least 1.5. In any case, the source dielectric part 346 is made to be thicker than the gate dielectric part 348 (subject at the transition from the source dielectric part 346 to the gate dielectric part 348, at which the trench dielectric 344 has, as a matter of course, the same thickness).

According to an embodiment, the semiconductor body comprises silicon, the trench dielectric 344 comprises silicon oxide and the gate electrode 342 comprises polycrystalline silicon. In addition, the first conductivity type is an n-type and the second conductivity is a p-type. When forming the n-type source zone 310 by an n-source implantation, the trench dielectric 344 may get damaged by the implanted ions such as As, P or Sb. The damage of a thin gate dielectric of about 10 nm leads to high gate to source leakage currents at low voltages. This is a drawback with regard to life-time or reliability requirements, for example for automotive applications. It should be emphasized that an implantation of boron for the p+-implantation does not lead to comparable damages due to its smaller ionic mass. Thus, by providing a source dielectric part 346 being thicker than the gate dielectric part 348, a region of the trench dielectric 344 damaged by the n-source implantation is made thicker and thus leakage currents from the gate dielectric 342 to the source zone 310 are significantly reduced, as can be seen from FIG. 10.

Figure 10:
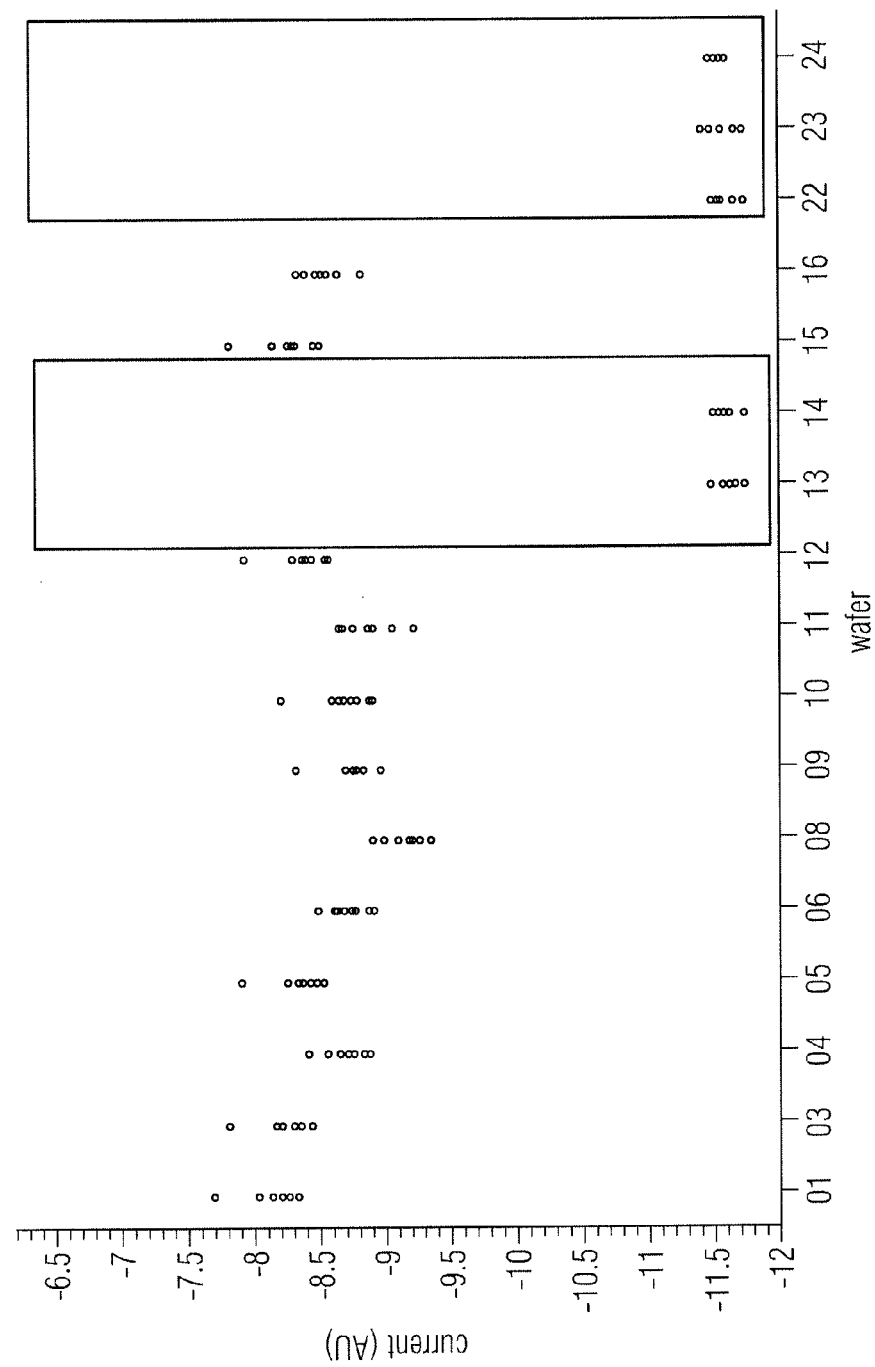
FIG. 10 is a diagram showing a leakage current of different wafers having different trench gate structures.

FIG. 10 shows a statistics chart of a plurality of wafers having gate dielectric structures as shown in FIG. 7 (wafers 1 to 11, 15, and 16) or as shown in FIG. 8 (wafers 13, 14, 22, 23, and 24). The minimum thickness of the gate dielectric part 346 was equal for all wafers. It can be seen from FIG. 10 that semiconductor devices having a trench gate structure, in which the ratio of a maximum thickness a of the source dielectric part 348 along a lateral direction x and the minimum thickness b of the gate dielectric part 348 along the lateral direction x is at least 1.5, have a significantly reduced leakage current between the gate electrode 342 and the source zone 310.

Figure 11:
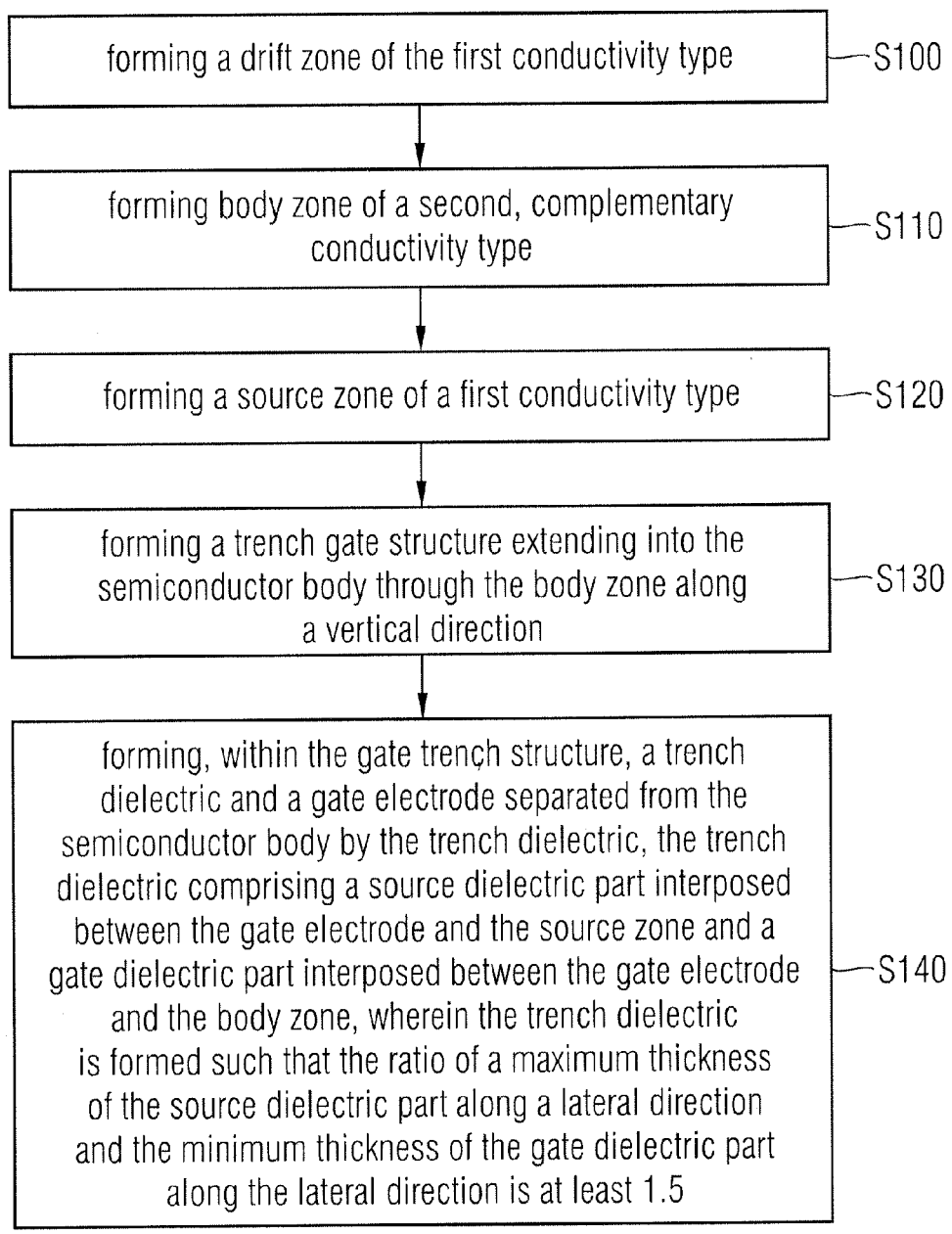
FIG. 11 illustrates an embodiment of a method of manufacturing a semiconductor device.

FIG. 11 illustrates an embodiment of a method of manufacturing the semiconductor device 100 according to an embodiment, wherein the semiconductor device 100 comprises a semiconductor body 200, and the semiconductor body 200 comprises insulated gate field effect transistor cells 300. The method comprises the following process features for forming at least one of the insulated gate field effect transistor cells 300.

Process feature S100 includes forming a drift zone of the first conductivity type.

Process feature S110 includes forming a body zone of a second, complementary conductivity type.

Process feature S120 comprises forming a source zone of a first conductivity type.

Process feature 5130 comprises forming a trench gate structure extending into the semiconductor body through the body zone along a vertical direction.

Process feature S140 comprises forming, within the gate trench structure, a trench dielectric and a gate electrode separated from the semiconductor body by the trench dielectric, the trench dielectric comprising a source dielectric part interposed between the gate electrode and the source zone and a gate dielectric part interposed between the gate electrode and the body zone, wherein the trench dielectric is formed such that the ratio of a maximum thickness of the source dielectric part along a lateral direction and the minimum thickness of the gate dielectric part along the lateral direction is at least 1.5. The sequence of carrying out the process features S100 to S140 may deviate from the sequence S100, S110, S120, S140.

According to an embodiment, the minimum thickness of the gate dielectric part is at most 20 nm, and the maximum thickness of the source dielectric part is at least 10 nm. According to another embodiment, the method comprises performing a wet oxidation process such that the ratio of a maximum thickness of the source dielectric part along the lateral direction and the minimum thickness of the gate dielectric part along the lateral direction becomes at least 1.5. According to yet another embodiment, the method comprises forming, in addition to the insulated gate field effect transistor cells, further circuit elements, wherein at least one of the circuit elements comprises a transistor having a gate dielectric with a thickness varying at most 10% of the minimum thickness of the gate dielectric part.

Figure 12:
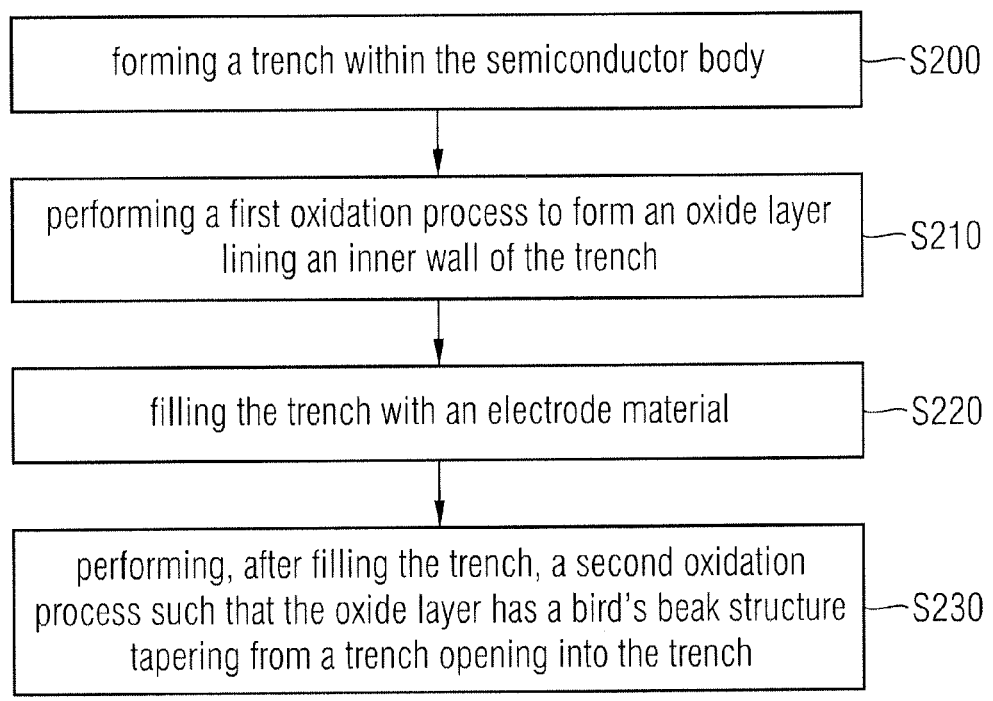
FIG. 12 illustrates another embodiment of a method of manufacturing a semiconductor device.

FIG. 12 illustrates another embodiment of a method of manufacturing a semiconductor device comprising a semiconductor body.

Process feature S200 comprises forming a trench within the semiconductor body.

Process feature S210 comprises performing a first oxidation process to form an oxide layer lining an inner wall of the trench.

Process feature S220 comprises filling the trench with an electrode material.

Process feature S230 comprises performing, after filling the trench, a second oxidation process such that the oxide layer has a bird's beak structure tapering from a trench opening into the trench.

According to an embodiment, the semiconductor body is of silicon. According to another embodiment, the electrode material is of polycrystalline silicon. In an embodiment, the second oxidation process may be a wet oxidation process.

In the following, an embodiment of a method of manufacturing the semiconductor device 100 will be discussed on the basis of FIG. 6 and FIG. 8.

First of all, within the semiconductor body 200, a p-type body zone 320 is formed within the n-type drift zone 330, e.g. by a deep implantation process, as described with regard to FIG. 4.

As shown in FIG. 6, trenches 341 of the trench gate structures 340 and an edge termination trench 510 are formed, e.g. by etching, which extend from the first surface 201 into the semiconductor body 200. Thereafter, a field dielectric 392 and a field dielectric 514 is deposited within the trenches 341 and 510, respectively, e.g. by a wet oxidation process. Thereafter, the trenches 341 and the edge termination trench 510 are filled with a conductive material to form field electrodes 390 and 512. After etching back of the field dielectric 392 and the field electrode 390 in the insulated gate field effect transistor cells 300, the trench 341 formed within the semiconductor body 200 is provided with an oxide layer, i.e. the trench dielectric 344, which lines an inner wall of the trench 341. As can be seen from the dielectric part 394 interposed between the field electrode 390 and the gate electrode 342, the oxidation of the polycrystalline silicon field electrode 390 is faster than the dry oxidation of the inner wall of trench 341, which is formed by the semiconductor body 200 of silicon. Thus, the dielectric part 394 is thicker than the trench dielectric 344 lining the inner wall of the trench 341 of the trench gate structure 340. Thereafter, the trench 341 is filled with polycrystalline silicon to form the gate electrode 342 separated from the semiconductor body 200 by the trench dielectric 344.

After forming the trench gate structure 340, source zones 310 are formed by an n-type implantation process. Herein, n-dopants such as As, P or Sb are implanted into the semiconductor body 200, wherein the source zones 310 extend from the first surface 201 into the semiconductor body up to a desired depth, e.g. of 200 nm (cf. FIG. 4). As described above, the implantation of n-dopants leads to a damage of the trench dielectric 344 having, according to an embodiment, a thickness of at most 20 nm. Thus, after filling the trench 341 with the gate electrode 342, a wet oxidation process is performed such that the oxide layer or the trench dielectric 344 has a bird's beak structure tapering from a trench opening into the trench 341, as can be seen from FIG. 8. The wet oxidation process may be realized by a LOCOS-process. The wet oxidation process may be performed before or after the implantation process of the source zone 310. The oxide thickness of the additional wet oxidation process may be adapted to the trench geometry and the parameters of the n-source implantation process. The additional oxide layer thickness caused by the wet oxidation process lies, according to an embodiment, within 7 nm to 30 nm. Thus, by providing a trench dielectric 344 formed by a dry oxidation process having a thickness of e.g. 8 nm, the thickness of the trench dielectric 344 in an upper part near to the first surface 201 is about twice, and up to a factor of 5, thicker than the trench dielectric 344 in a channel region lying between the body zone 320 and the gate electrode 342. The bird's beak structure as shown in FIG. 8 is a typical structure which is generated by performing a wet oxidation process extending into a confined dielectric structure.

As already emphasized above, formation of the source zone 310 may be performed before performing the wet oxidation process or after performing the wet oxidation process. In any case, the damages in the trench dielectric 344 between the source zone 310 and the gate electrode 342 are reduced, leading to a significant reduction of leak currents, as discussed with regard to FIG. 10. Thus, the trench dielectric 344 has a bird's beak structure as shown in FIG. 8, which tapers from the source dielectric part 346 to the gate dielectric part 348, wherein the ratio of a maximum thickness a of the source dielectric part 346 along a lateral direction x and the minimum thickness b of the gate dielectric part 348 along the lateral direction x is at least 1.5. Although damages of a thin gate dielectric may be reduced by implantation of phosphor instead of arsenide for a gate dielectric thickness above 8 nm, the enhancement of thickness of the source dielectric part 346 in comparison to the gate dielectric part 348 has to be performed for a minimum thickness of the gate dielectric part 348 lower than 8 nm.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a semiconductor body, the semiconductor body comprising insulated gate field effect transistor cells, at least one of the insulated gate field effect transistor cells comprising
    a source zone of a first conductivity type,
    a body zone of a second, complementary conductivity type,
    a drift zone of the first conductivity type, and
    a trench gate structure extending into the semiconductor body through the body zone along a vertical direction and comprising a gate electrode separated from the semiconductor body by a trench dielectric, the trench dielectric comprising a source dielectric part interposed between the gate electrode and the source zone and a gate dielectric part interposed between the gate electrode and the body zone, wherein:
    the ratio of a maximum thickness of the source dielectric part along a lateral direction and the minimum thickness of the gate dielectric part along the lateral direction is at least 1.5;
    a net dopant concentration of a center portion of the body zone is higher than a net dopant concentration of an end portion of the body zone, the center portion located in a center part of the body zone along the vertical direction, the end portion located in an end part of the body zone along the vertical direction and adjoining the source zone; and
    a thickness of the gate dielectric part interposed between the gate electrode and the end portion of the body zone along the lateral direction is greater than a thickness of the gate dielectric part interposed between the gate electrode and the center portion of the body zone along the lateral direction.

2. The semiconductor device of claim 1, wherein the minimum thickness of the gate dielectric part is at most 20 nm and the maximum thickness of the source dielectric part is at least 10 nm.

3. The semiconductor device of claim 1, wherein the trench dielectric has a bird's beak structure tapering from the source dielectric part to the gate dielectric part.

4. The semiconductor device of claim 1, wherein the trench dielectric comprises silicon oxide.

5. The semiconductor device of claim 1, wherein the gate electrode comprises polycrystalline silicon.

6. The semiconductor device of claim 1, wherein the body zone has an average net dopant concentration of at least $1*10^{17}$ cm$^{-3}$.

7. The semiconductor device of claim 1, wherein the body zone has a net dopant concentration peak profile along the vertical direction, which declines from the peak towards the source zone, which declines from the peak towards the drift zone, and which has a peak net dopant concentration of at least $5*10^{17}$ cm$^{-3}$.

8. The semiconductor device of claim 7, wherein the maximum of the net dopant concentration profile is located in a center part of the body zone along the vertical direction.

9. The semiconductor device of claim 1, wherein the length of the body zone along the vertical direction is greater than 500 nm.

10. The semiconductor device of claim 1, wherein the trench gate structure further comprises a field electrode.

11. The semiconductor device of claim 1, wherein the semiconductor device is an integrated circuit comprising the insulated gate field effect transistor cells and further circuit elements, at least one of the further circuit elements comprising a transistor having a gate dielectric with a thickness varying at most 10% of the minimum thickness of the gate dielectric part.

12. The semiconductor device of claim 1, further comprising an edge termination electrode adjoining a field dielectric within an edge termination trench.

13. The semiconductor device of claim 1, wherein the threshold voltage of the at least one of the vertical insulated gate field effect transistor cells is in a range of 1 V to 5 V.

14. A method of manufacturing a semiconductor device comprising a semiconductor body including insulated gate field effect transistor cells, the method comprises forming of at least one of the insulated gate field effect transistor cells by
forming a drift zone of the first conductivity type,
forming a body zone of a second, complementary conductivity type,
forming a source zone of a first conductivity type,
forming a trench gate structure extending into the semiconductor body through the body zone along a vertical direction, and
forming, within the gate trench structure, a trench dielectric and a gate electrode separated from the semiconductor body by the trench dielectric, the trench dielectric comprising a source dielectric part interposed between the gate electrode and the source zone and a gate dielectric part interposed between the gate electrode and the body zone, wherein:
the trench dielectric is formed such that the ratio of a maximum thickness of the source dielectric part along a lateral direction and the minimum thickness of the gate dielectric part along the lateral direction is at least 1.5;
a net dopant concentration of a center portion of the body zone is higher than a net dopant concentration of an end portion of the body zone, the center portion located in a center part of the body zone along the vertical direction, the end portion located in an end part of the body zone along the vertical direction and adjoining the source zone; and
a thickness of the gate dielectric part interposed between the gate electrode and the end portion of the body zone along the lateral direction is greater than a thickness of the gate dielectric part interposed between the gate electrode and the center portion of the body zone along the lateral direction.

15. The method of claim 14, wherein the minimum thickness of the gate dielectric part is at most 20 nm and the maximum thickness of the source dielectric part is at least 10 nm.

16. The method of claim 14, further comprising performing a wet oxidation process such that the ratio of a maximum thickness of the source dielectric part along the lateral direction and the minimum thickness of the gate dielectric part along the lateral direction becomes at least 1.5.

17. The method of claim 14, further comprising forming, in addition to the insulated gate field effect transistor cells, further circuit elements, at least one of the circuit elements comprising a transistor having a gate dielectric with a thickness varying at most 10% of the minimum thickness of the gate dielectric part.

18. A method of manufacturing a semiconductor device comprising a semiconductor body, the method comprising
forming a trench within the semiconductor body,
performing a first oxidation process to form an oxide layer lining an inner wall of the trench,
filling the trench with an electrode material, and
performing, after filling the trench, a second oxidation process such that the oxide layer has a bird's beak structure tapering from a trench opening into the trench.

19. The method of claim 18, wherein the semiconductor body is of silicon.

20. The method of claim 18, wherein the electrode material is of polycrystalline silicon.

21. The semiconductor device of claim 9, wherein the length of the source zone along the vertical direction is less than or equal to 200 nm.

* * * * *